United States Patent [19]

Lin

[11] Patent Number: 5,526,875

[45] Date of Patent: Jun. 18, 1996

[54] COOLING DEVICE FOR CPU

[76] Inventor: Shih-jen Lin, No. 360, Tanan Rd., Taipei, Taiwan

[21] Appl. No.: 323,383

[22] Filed: Oct. 14, 1994

[51] Int. Cl.[6] .................................................... F28F 13/12
[52] U.S. Cl. ........................ 165/80.3; 165/122; 361/697; 415/213.1
[58] Field of Search ................................... 165/80.3, 122, 165/185; 174/16.3; 257/722; 361/695, 397; 415/213.1, 178

[56] References Cited

U.S. PATENT DOCUMENTS

| | | | |
|---|---|---|---|
| 3,285,328 | 11/1966 | Woodward | 165/121 X |
| 4,130,376 | 12/1978 | Dietsche | 415/213.1 |
| 4,412,478 | 11/1983 | Osher et al. | 415/213.1 X |
| 4,513,812 | 4/1985 | Papsi et al. | 165/121 X |
| 4,739,445 | 4/1988 | Tragen | 361/695 |
| 4,911,231 | 3/1990 | Horne et al. | 165/122 X |
| 5,288,203 | 2/1994 | Thomas | 415/178 |
| 5,309,983 | 5/1994 | Bailey | 165/80.3 |
| 5,335,722 | 8/1994 | Wu | 165/122 |
| 5,409,352 | 4/1995 | Lin | 165/80.3 X |

FOREIGN PATENT DOCUMENTS

| | | | |
|---|---|---|---|
| 49700 | 3/1987 | Japan | 165/80.3 |
| 113460 | 7/1988 | Japan | 165/80.3 |

*Primary Examiner*—Leonard R. Leo
*Attorney, Agent, or Firm*—Kolisch, Hartwell, Dickinson, McCormack & Heuser

[57] ABSTRACT

A cooling device includes a radiator including a plate, a number of fins projecting upwardly from the plate and a recess defined among the fins. The cooling device further includes a flow-guiding cover including a top member and a periphery projecting downwardly from the top member. The top member of the flow-guiding cover defines an inlet. The periphery of the flow-guiding cover defines an outlet. The flow-guiding cover is mounted on the radiator so that the fins are oriented towards the outlet. The cooling device further includes a fan receivable in the recess.

1 Claim, 5 Drawing Sheets

COOLING DEVICE FOR CPU

BACKGROUND OF THE INVENTION

1. Field of the Invention

This invention relates to a cooling device for a central process unit (CPU) and, more particularly, to a cooling device including a radiator, a fan and a flow-guiding cover.

2. Related Prior Art

A prior-art cooling device includes a fan secured by means of a number of screws to a radiator from which a number of fins project upwardly. The radiator is mounted on a CPU. The CPU is mounted on a frame from which a number of hooks project upwardly for engaging with the radiator. A first drawback of the prior-art cooling device is that the total thickness of the cooling device is too large to be disposed in a notebook computer.

The fan produces a downward cool air flow to the fins. The cooling-effect of the prior-art cooling device will be high if the air flow is smooth. However, as heat is transmitted from the fins to the air passing the fins, there is produced an upward hot air flow from the fins. A second drawback of the prior-art cooling device is the cooling effect thereof is low as the downward cool air flow will be hindered by the upward hot air flow.

The CPU is mounted on a printed circuit board (PCB) on which other components are also mounted. The prior-art cooling device is mounted on the CPU. Heat will be dissipated from the CPU in various directions, thus influencing the other components.

SUMMARY OF THE INVENTION

It is an objective of this invention to provide a radiator which is small in size.

It is another objective of this invention to provide a radiator which is better in efficiency.

The above-mentioned objectives of this invention are achieved by providing a cooling device including a radiator including a plate, a number of fins projecting upwardly from the plate and a recess defined among the fins. The cooling device further includes a flow-guiding cover including a top member, an inlet defined in the top member, a periphery projecting downwardly from the top member and an outlet defined in the periphery. The flow-guiding cover is mounted on the radiator so that the fins are oriented towards the outlet. The cooling device further includes a fan receivable in the recess.

DETAILED DESCRIPTION OF THE EMBODIMENTS

Figure 8:
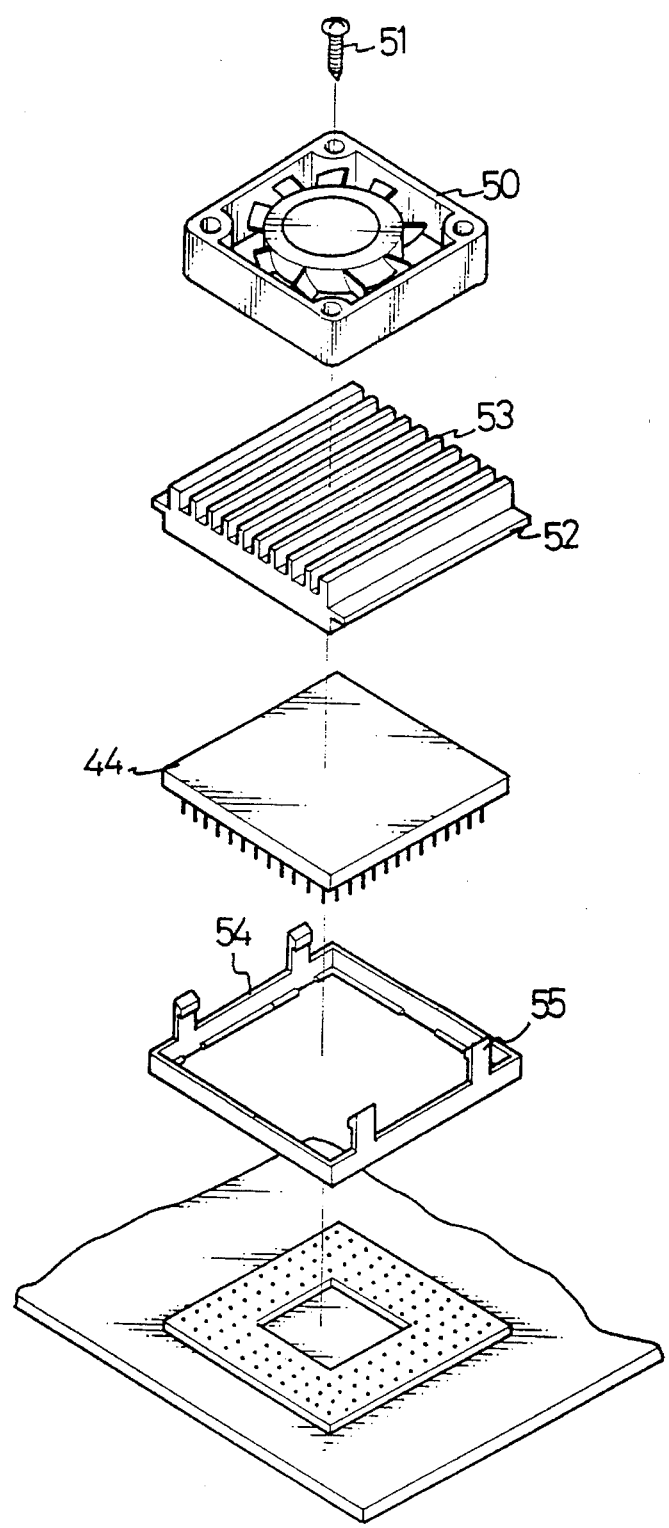
FIG. 8 is an exploded view of a prior-art cooling device according to prior art.
Figure 9:
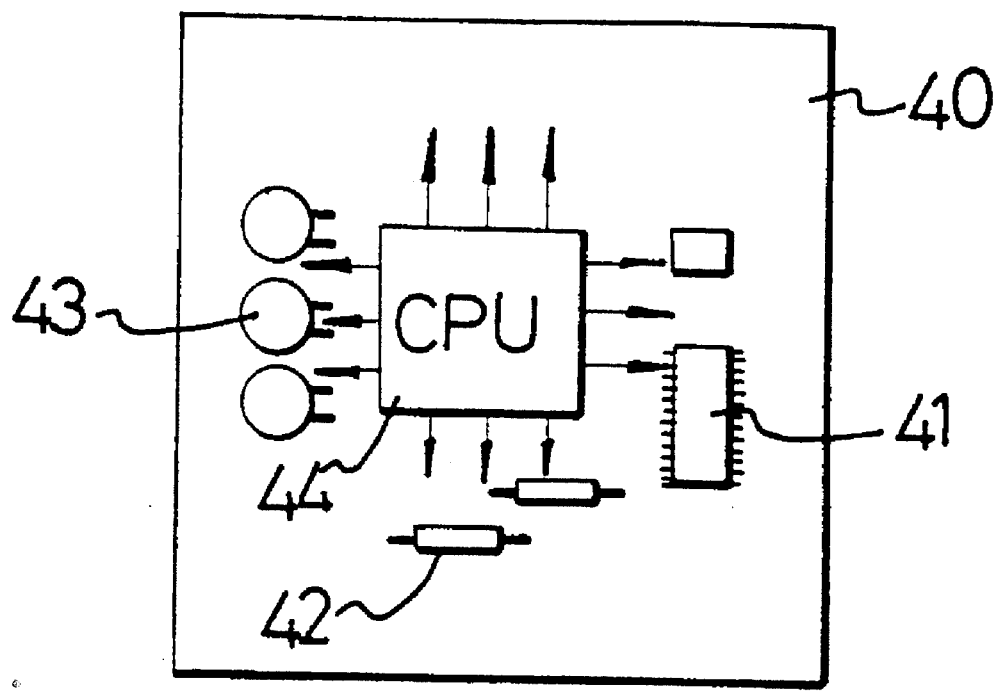
FIG. 9 is a top view of the prior-art cooling device mounted on a CPU.

To show advantages of this invention over prior art, description will be given to a prior-art cooling device as shown in FIGS. 8 and 9.

Referring to FIG. 8, the prior-art cooling device includes a fan 50 secured by means of a number of screws 51 (only one is shown) to a radiator 52 from which a number of fins 53 project upwardly. The radiator 52 is mounted on a CPU 44. The CPU 44 is mounted on a frame 54 from which a number of hooks 55 project upwardly for engaging with the radiator 52. A first drawback of the prior-art cooling device is that the total thickness thereof is too large to be installed in a notebook computer.

The fan 50 produces a downward cool air flow to the fins 53. The cooling effect of cooling devices will be high if the air flow is smooth. However, as heat is transmitted from the fins 53 to the air passing the fins 53, there is an upward hot air flow from the fins 53. A second drawback of the prior-art cooling device is the cooling effect thereof is low as the downward cool air flow will be hindered by the upward heat air flow.

FIG. 9 shows a printed circuit board (PCB) 40 on which a plurality of components such as those indicated with 41, 42 and 43 and a CPU 44 are mounted. The prior-art cooling device (not shown) is mounted on the CPU 44. Heat will be dissipated from the CPU in various directions as shown by arrows, thus influencing the components such as those indicated with 41, 42 and 43.

Figure 1:
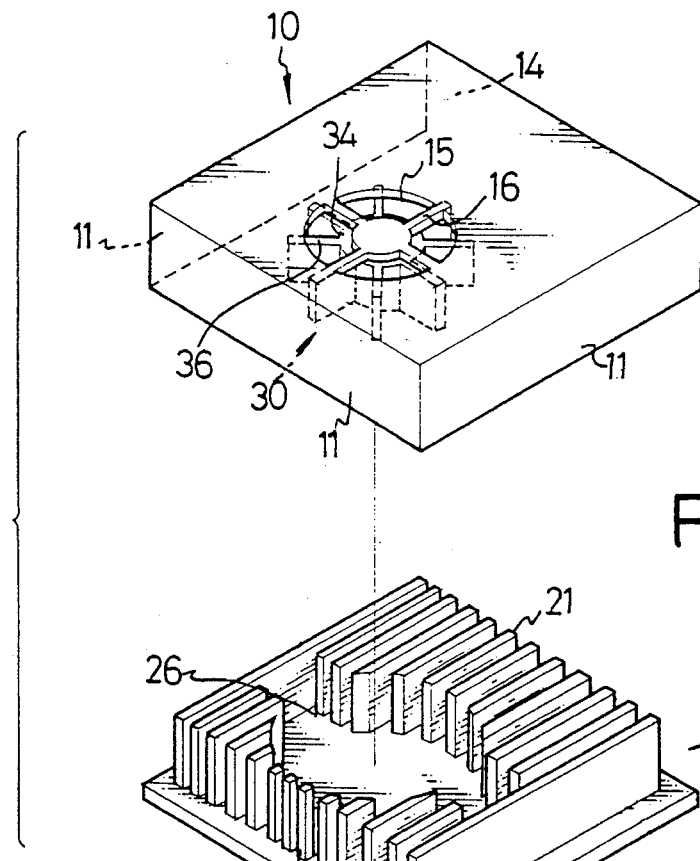
FIG. 1 is an exploded view of a first embodiment of a cooling device for a CPU according to this invention, wherein the cooling device includes a radiator, a fan and a flow-guiding cover.

Referring to FIG. 1, a cooling device includes a radiator 20 which is mounted on a CPU (see FIG. 5), a flow-guiding cover 10 mounted on the radiator 20 and a fan 30 attached to the flow-guiding cover 10.

Similar to any conventional radiator, the radiator 20 includes a plate 25 mounted on the CPU and a plurality of fins 21 projecting upwardly from the plate 25. Unlike any conventional radiator, the radiator 20 defines a recess 26 among the fins 21.

The fan 30 includes an axle 32 (see FIGS. 3 and 4), a hub 34 mounted on the axle 32 and a number of blades 36 projecting radially from the hub 34. The blades 36 are flat members which are perpendicular to the plate 25 when the fan 30 installed. Thus, the fan 30 is rotatable for producing an air flow over the plate 25, in contrast to any prior-art fan incorporated with a radiator for a CPU.

The flow-guiding cover 10 includes a top member (not numbered) and a periphery 11 projecting downwardly from the top member. In the embodiments, the top member of the flow-guiding cover 10 is in the form of a square, i.e., it includes four edges of equal length. The periphery includes three continuous flat portions. Each of the flat portions of the periphery 11 projects downwardly from one of the edges of the top member of the flow-guiding cover 10. Thus, the periphery 11 defines an outlet 14. The top member of the flow-guiding cover 10 defines a number of inlets 15 each in the form of a sector. The inlets 15 are separated by means of a corresponding number of strips 16 projecting from a circular portion (not numbered) on which the axle of the fan 30 is mounted.

The periphery 11 is mounted on the plate 25 so that the fins 21 extend towards the outlet 14.

Figure 2:
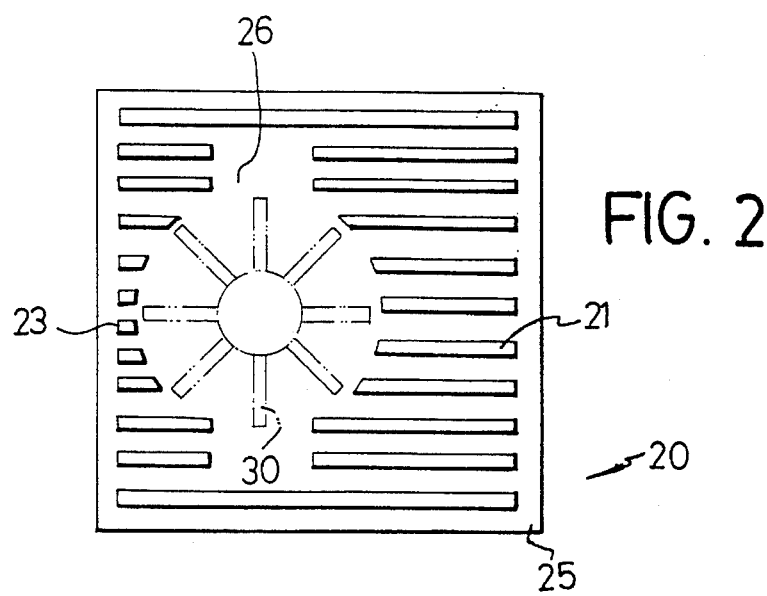
FIG. 2 is a top view of the radiator shown in FIG. 1.

FIG. 2 shows the fan 30 (in phantom lines) receivable in the recess 26 defined in the radiator 20 (in bold lines).

Figure 3:
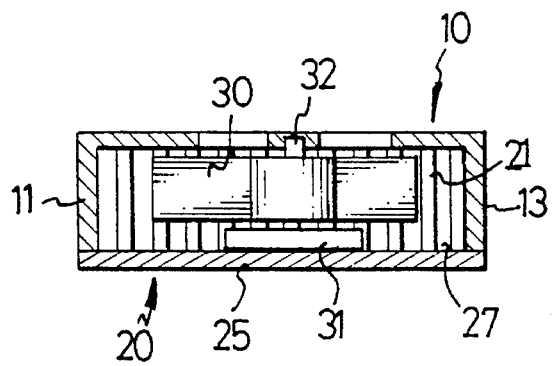
FIG. 3 is a cross-sectional view of the embodiment shown in FIG. 1.

Referring to FIG. 3, according to a first embodiment, a circuit board 31 is disposed below the fan 30. The circuit board 31 is operatively connected with the fan 30.

Figure 4:
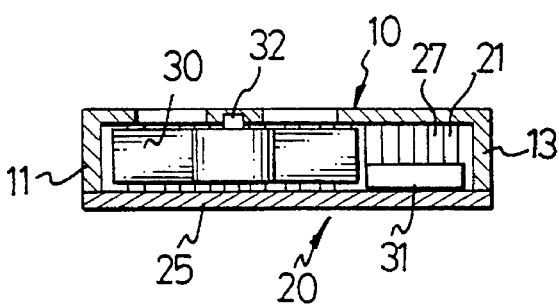
FIG. 4 is a cross-sectional view of a second embodiment of the cooling device according to this invention.

Referring to FIG. 4, according to a second embodiment, the circuit board 31 is disposed beside the fan 30 thus reducing the thickness of the entire cooling device.

Figure 5:
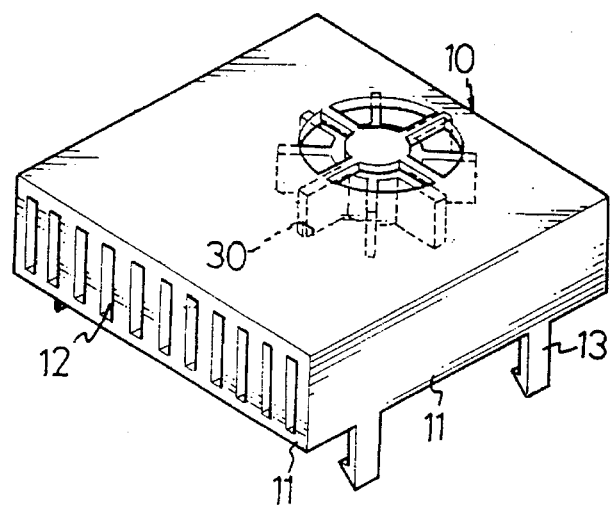
FIG. 5 is an isometric view of another embodiment of a flow-guiding cover according to this invention.

FIG. 5 shows another embodiment of the flow-guiding cover 10. The periphery 11 includes four conjunctive flat portions. A plurality of slots 12 are defined in one of the flat portions of the periphery 11 which is between two of the flat portions of the periphery 11 from each of which two hooks 13 project. The hooks 13 are engageable with the CPU for securing the cooling device to the CPU.

Figure 6:
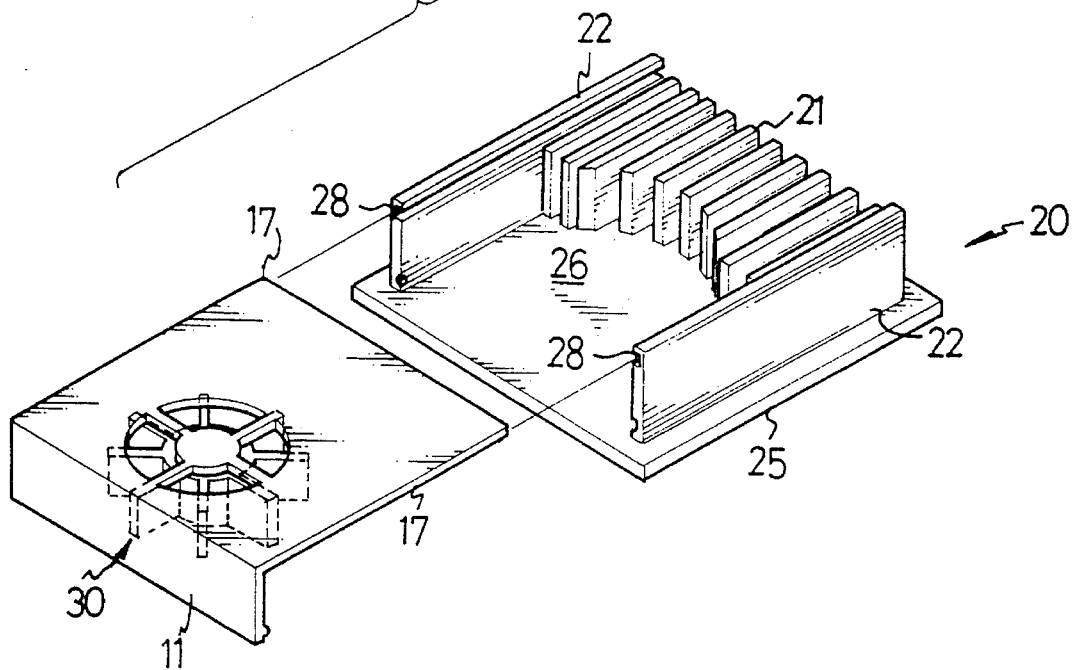
FIG. 6 is an exploded view of a third embodiment of a cooling device according to this invention.

FIG. 6 shows another embodiment of the cooling device according to this invention. All of the fins 21 are located at a side of the recess 26. The radiator 20 includes two parallel walls 22 raised from the plate 25. The walls 22 each define a groove 28 so that the grooves 28 face each other. The flow-guiding cover 10 includes a top member and a flat portion 11' projecting downwardly from the top member thereof. The flow-guiding cover 10 includes two parallel edges 17 receivable in the grooves 28 defined in the walls 22 for mounting the cover 10 on the radiator 20 while the fan 30 is receivable in the recess 26.

Figure 7:
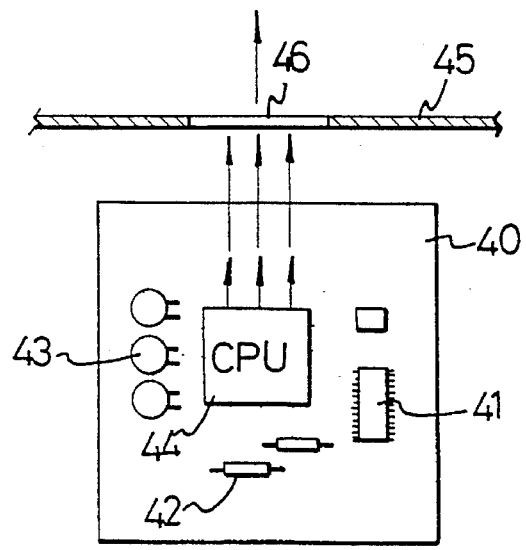
FIG. 7 is a top view of the cooling device mounted on a CPU according to this invention.

FIG. 7 shows the printed circuit board (PCB) 40 on which a plurality of components such as those indicated with 41, 42 and 43 and a CPU 44 are mounted. The PCB 40, the components 41, 42 and 43 and the CPU 44 are received in a computer 15 defining an opening 46. The cooling device (not shown) can be mounted on the CPU 44 so that the outlet 14 is aligned with the opening 46. Thus, heat will be dissipated from the CPU 44 in a direction indicated by arrows through the outlet 14 and the opening 46 to the exterior of the computer 45 without influencing the components such as those indicated with 41, 42 and 43.

The drawbacks of the prior-art cooling device are solved by the cooling device according to this invention.

I claim:

1. A cooling device comprising a radiator including a plate, a number of fins projecting upwardly from the plate, two walls projecting upwardly from the plate so that the fins are located between and oriented parallel to the walls, two grooves each defined in one of the walls and a recess defined beside the fins, a flow-guiding cover including a top member with two parallel edges, an inlet defined in the top member and a flat member projecting downwardly from the top member, and a fan attached to the top member wherein the parallel edges of the flow-guiding cover are receivable in the grooves defined in the walls for mounting the flow-guiding cover on the radiator while the fan is receivable in the recess.

* * * * *